United States Patent
Mandorlo et al.

(10) Patent No.: US 8,326,098 B2
(45) Date of Patent: Dec. 4, 2012

(54) GALLERY-MODE MICRODISC SYSTEM FOR ELECTRICALLY PUMPED OPTICAL SOURCES

(75) Inventors: Fabien Mandorlo, Ecully (FR); Jean-Marc Fedeli, Saint Egreve (FR); Pedro Rojo-Romeo, Lyons (FR)

(73) Assignees: Commissariat a l'Energie Atomique, Paris (FR); Centre National de la Recherche Scientifique, Paris (FR); Ecole Centrale de Lyon, Ecully Cedex (FR)

( * ) Notice: Subject to any disclaimer, the term of this patent is extended or adjusted under 35 U.S.C. 154(b) by 587 days.

(21) Appl. No.: 12/400,154

(22) Filed: Mar. 9, 2009

(65) Prior Publication Data

US 2010/0061416 A1    Mar. 11, 2010

(30) Foreign Application Priority Data

Mar. 12, 2008    (FR) ...................... 08 51604

(51) Int. Cl.
*G02B 6/26* (2006.01)
*H01S 3/06* (2006.01)
*H01S 3/083* (2006.01)

(52) U.S. Cl. ................. 385/39; 372/67; 372/94
(58) Field of Classification Search ............ 372/67, 372/94

See application file for complete search history.

(56) References Cited

U.S. PATENT DOCUMENTS

| 4,431,308 A | 2/1984 | Mitsuhashi et al. | |
|---|---|---|---|
| 5,317,587 A | 5/1994 | Ackley et al. | |
| 5,343,490 A | 8/1994 | McCall | |
| 6,275,296 B1 | 8/2001 | Numai | |
| 6,665,476 B2 * | 12/2003 | Braun et al. | 385/50 |
| 7,561,770 B2 * | 7/2009 | Tan et al. | 385/32 |

FOREIGN PATENT DOCUMENTS

| EP | 0533390 A1 | 2/1984 |
|---|---|---|
| EP | 0995969 A2 | 4/2000 |
| WO | 2005053000 A2 | 6/2005 |

OTHER PUBLICATIONS

Thiyagarajan et al; "Continuous room-temperature operation of microdisk laser diodes", Electronics Letters, IEE Stevenage, GB, vol. 35, No. 15, Jul. 22, 1999 pp. 1252-1254.

Van Campenhout et al; "Design Optimization of Electrically Injected InP-Based Microdisk Lasers Integrated on and Coupled to a SOI Waveguide Circuit" Journal of Lightwave Technology, IEEE Service Center, New York, NY United States, vol. 26, No. 1 Jan. 1, 2008, pp. 52-63.

French Search Report for French application No. FR 0851604, dated Nov. 4, 2008.

* cited by examiner

*Primary Examiner* — Omar Rojas
(74) *Attorney, Agent, or Firm* — Pearne & Gordon LLP

(57) ABSTRACT

The invention concerns a gallery mode microdisc system for an electrically pumped optical source, the microdisc (1) being formed on one face of a substrate (2), the lower part of the microdisc being provided with an electrical contact referred to as the lower contact (4), the upper part of the microdisc being provided with an electrical contact referred to as the upper contact (6), the upper part of the microdisc being covered with a protective layer (3) of electrically insulating material, the central part (5) of the microdisc being electrically neutralized in order to prevent the passage of an electric current in said central part.

21 Claims, 2 Drawing Sheets

GALLERY-MODE MICRODISC SYSTEM FOR ELECTRICALLY PUMPED OPTICAL SOURCES

TECHNICAL FIELD

The invention relates to gallery mode microdisc systems for electrically pumped optical sources. It concerns in particular the integration of the optics in electronic systems for generating optical signals.

PRIOR ART

Microlasers are known where the resonator consists of a microdisc or micro-ring. A microdisc or micro-ring resonator, using gallery modes (referred to "whispering gallery modes" in articles in English) makes it possible to obtain a high confinement of the photons. The same applies to a microresonator consisting of a microstructure based on photonic crystal with one or two dimensions.

Gallery mode (GM) discs are characterised by electromagnetic modes complying with the geometry of revolution of the disc: the modes are therefore distinguished by their radial order (number of nodes on a radius), their azimuth order (the number of periods) and their vertical order (the number of nodes in the thickness of the disc). These discs are produced from a high-index material comprising a gain medium, and are immersed in a medium with a lower index (air, silica, etc.), little absorbent, or not at all, to the wavelength of interest.

The modes with the highest quality factor corresponding to zero radial and vertical orders, the modes generally used for producing a GM laser are therefore situated at the periphery of the disc. The use of fine membranes (thickness below the wavelength, limiting the vertical orders, for producing the disc results in modes that are little confined, normally referred to as "TE mode" (or "quasi-TE") or "TM mode" (or "quasi-TM") according to the dominant direction of the magnetic field, perpendicular to the plane of the disc or in its plane. For these fine membranes, the evanescent field in the vertical direction is significant; it can moreover be used for effecting coupling to a guide. Though optical pumping of such devices can easily be achieved the same does not apply with electrical pumping. The presence of electrical contacts on the principal faces of the microdisc can cause sizeable losses due to their absorption in the infrared (or the working wavelength). It is therefore important to control the way in which electrical contacts with the disc are made.

The lower contact of the microdisc (that is to say the contact situated on the face of the microdisc closest to the supporting substrate) can be produced in various ways. The lower contact can be with a pedestal (see the document "Continuous wave lasing in GaInAsP microdisk injection laser with threshold current of 40 μA" by M. Fujita et al., Electronics Letters, 27 Apr. 2000, Vol. 36, No. 9) or leaving a high-index conductive layer to offset the contact to the side of the disc (see the document "Heterogeneous integration of electrically driven microdisk based laser sources for optical interconnects and photonic ICs" by P. Rojo Romeo et al., Optics Express, Vol. 14, No. 9, pages 3864 to 3871, 1 May 2006). The latter solution is difficult to apply to the upper contact and the thickness left for the contact partly limits the quality factor.

The use of material for surrounding the disc and allowing use within an electronic chip gives rise to a lower index contrast than with a disc surrounded by air: it is then necessary to increase the size of the devices to achieve sufficient quality factors and reduce the threshold of the laser mode (typically around 2,000 at least).

To guarantee a high quality factor, at least one of the contacts, generally the upper contact, usually metal or more generally absorbent, is situated at the centre of the disc, with a radius necessarily lower than Reff, which corresponds to the maximum of the field in the disc. FIG. 1 is a graph showing the trend of the distribution of the magnetic field H in a microdisc of radius R as a function of the distance d with respect to the centre of the disc. The maximum value of the magnetic field Hmax is obtained for a value of d equal to Reff, Reff being less than the radius R of the disc.

The gain medium being situated in the disc, it can be remarked that:
- only the electron-hole recombinations at the edge of the disc participate in the high quality factor modes;
- the diffusion limits the performance of the device and it is necessary to contact as close as possible to the edge of the disc,
- currently at least one of the contacts systematically occupies the entire centre of the structure.

DISCLOSURE OF THE INVENTION

The aim of the invention is to limit the recombinations of unnecessary carriers at the centre of the disc by modifying the electrical properties of the latter and the geometry or even the nature of the contact. The present invention thus makes it possible to effectively inject carriers in order to obtain more effective pumping and a lower laser threshold.

An object of the invention is a gallery mode microdisc system for an electrically pumped optical source, the microdisc being formed on one face of a substrate and being parallel to the substrate, the part of the microdisc resting on the substrate, or lower part, being provided with an electrical contact referred to as the lower contact, the part of the microdisc opposite to the lower part of the microdisc, or upper part, being provided with an electrical contact referred to as the upper contact, the upper part of the microdisc being covered with a protective layer of electrically insulating material with an optical index lower than the optical index of the material constituting the microdisc, the central part of the microdisc being electrically neutralised in order to prevent the passage of an electric current in said central part.

The protective layer has double role. It guarantees a sufficient index contrast with the index of the microdisc in order to confine the optical mode. It also makes it possible to encapsulate the whole of the structure in order to obtain a mechanically rigid system.

Preferably, the substrate is a support used in microelectronics covered with a layer of electrically insulating material and with a low refractive index.

According to a first variant embodiment, the central part of the electrically neutralised microdisc is a part implanted with ions, for example $H^+$ ions.

According to a second variant embodiment, the central part of the microdisc is a core of electrically insulating material with a thickness less than or equal to that of the microdisc. Preferably the core is made from a material with a lower optical index than that of the material constituting the microdisc, for example made from $SiO_2$, $Si_3N_4$ or $SiO_xN_y$. The upper contact can be electrically connected to an electrical conductor of the substrate by an electrical connection passing through the core. The electrical connection is preferably made from a material that is little or not at all absorbent to the wavelength at which the microdisc system is intended to function. The lower contact may then be a ring through which the electrical connection passes.

According to a particular embodiment, the lower part of the microdisc has a greater diameter than the rest of the microdisc in order to constitute an annular part on which on which the lower contact is located.

Another object of the invention is an electrically pumped optical source comprising a microdisc system as defined above.

BRIEF DESCRIPTION OF THE DRAWINGS

The invention will be better understood and other advantages and particularities will emerge from a reading of the following description given by way of non-limitative example, accompanied by the appended drawings, in which.

DETAILED DISCLOSURE OF PARTICULAR EMBODIMENTS

Figure 1:
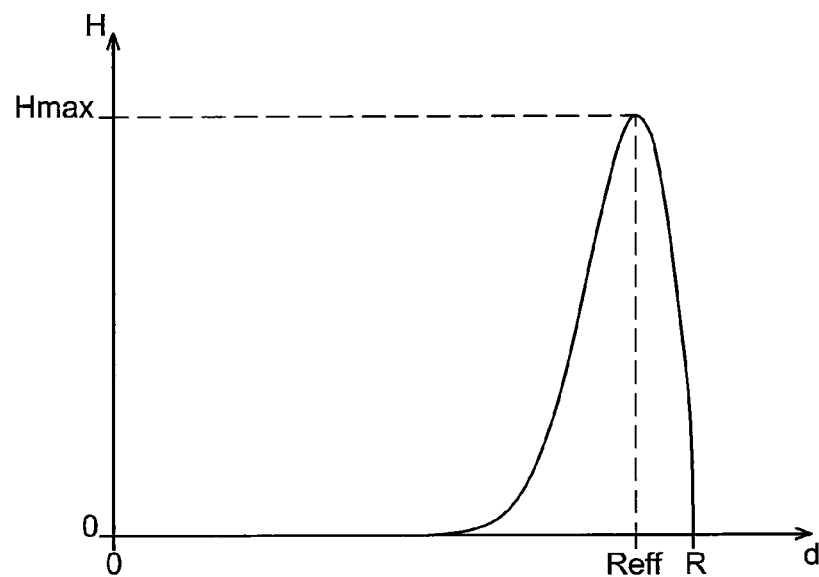
FIG. 1, already described, is a graph showing the trend of the distribution of the magnetic field in a gallery mode microdisc as a function of the distance with respect to the centre of the disc.
Figure 2:
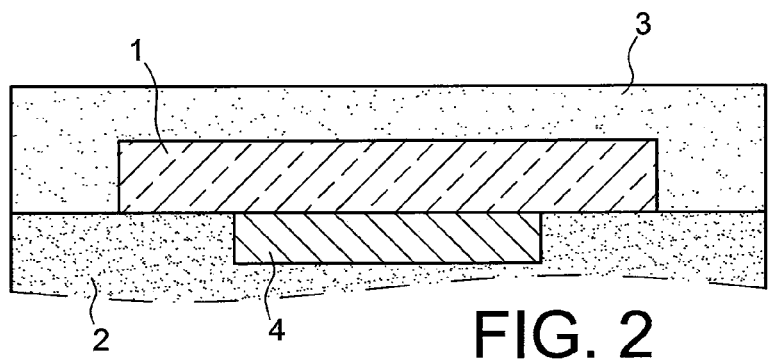
FIG. 2 is a view in transverse section of a microdisc on its supporting substrate during its production, according to the invention.

FIG. 2 is a view in transverse section of a microdisc on its supporting substrate during its production, according to the invention.

In FIG. 2, the reference 1 represents a microdisc, for example made from InP. The microdisc 1 is obtained by a technique known to persons skilled in the art. It is formed on a silicon substrate 2 (or on any other support used in microelectronics) covered with a layer of silicon oxide (or other electrically insulating material with a low refractive index). The lower and upper faces of the microdisc 1 comprise doped areas for obtaining an electrical contact with electrodes or contacts electrically connecting the faces of the microdisc with a current source.

The microdisc is covered with a protective layer 3 of material with a low optical index and electrically insulating. It is for example a layer of silica ($SiO_2$) or nitride ($Si_3N_4$) or an $SiO_xN_y$ compound deposited by vacuum deposition (PVD, PECVD, etc.) and with a thickness greater than or equal to that of the membrane 1.

The substrate 2 has a lower contact 4, for example made from ITO, for contacting the doped areas of the microdisc by virtue of a metallic bonding.

Steps of microelectronic processes can be provided after this. It may be a case of deposition, etching, etc. steps.

The current lines are of little interest in the centre of the microdisc. According to the invention, those normally passing through the centre of the microdisc are neutralised. The reference 5 represents a central part of the microdisc 1 electrically neutralised (see FIG. 3).

This neutralisation of the current lines can take place according to various methods, two of which will be described.

A first method consists of neutralising the central part of the doped area of the microdisc that produces one of the electrical contacts. For example, an implantation of $H^+$ ions electrically neutralises a region made from $p^+$ doped InP.

A second method consists of replacing the heart of the disc with a core made from electrically insulating material. The neutralised area will preferably be further away from the edges of the disc in order to leave space for the contact. This electrically insulating material may have a low optical index. It may be the same material as that of the protective layer 3, for example silica. In this case it should be noted that the structure obtained is different from a ring. This is because, for a ring, the mode is centred in the high-index structure, which is not the case here, since the field under the contact must be weak. In addition, this hollowed-out disc has a certain number of radial modes identical (in the spectral position) to those of the standard disc. Finally, this amounts to modifying the disc only in the areas where the field of the mode it is sought to excite is highly negligible, which also makes it possible to ignore the influence of the roughness on this internal wall.

Figure 3:
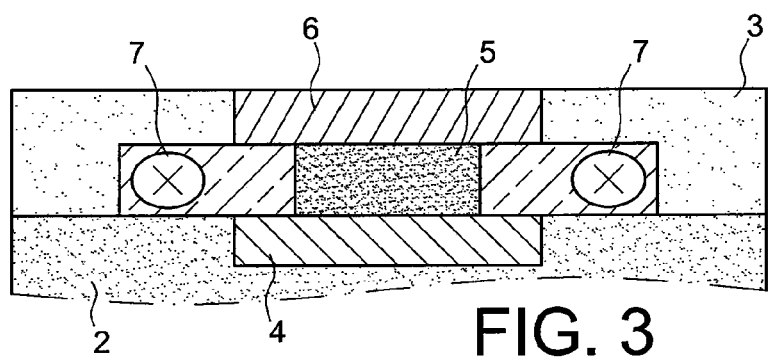
FIG. 3 is a view in transverse section of a microdisc on its supporting substrate at the end of production, according to the invention.

In FIG. 3, the reference 6 represents the upper contact. This contact is formed by etching the protective layer 3 until the microdisc is reached, in order to define the location of the upper contact. Before the formation of the upper contact, the central part of the microdisc is electrically neutralised, either by $H^+$ ion implantation, or by etching and filling of the central part with an electrically insulating material.

The reference 7 in FIG. 3 represents a gallery mode.

In FIG. 3, the entire thickness of the central part (or core) of the microdisc was neutralised. According to the variant embodiment shown in FIG. 4, the thickness of the core 5 is less than the thickness of the microdisc.

In the case of the use of an electrical insulator for neutralising the central part of the microdisc, the insulating core can be pierced along the axis of the microdisc for passage of an electrical connection to a metal connection layer situated in the substrate.

Figure 5:
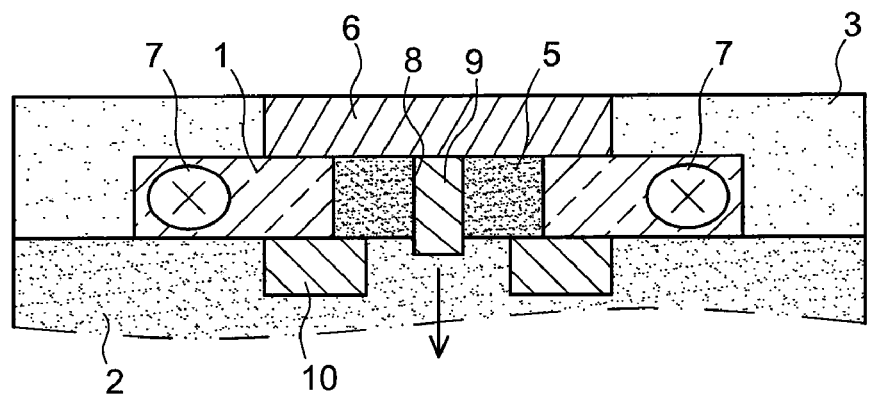
FIG. 5 is a view in transverse section of yet another microdisc on its supporting substrate at the end of production, according to the invention.

FIG. 5 illustrates such a solution. The core 5 made from electrically insulating material it has in it a central hole 8 obtained for example by etching. The hole 8 is filled with an electrically conductive material effecting an electrical connection 9 to the substrate 2 as indicated by the arrow in the figure. In this case, the lower electrical contact, referenced 10 in FIG. 5, may be a ring.

The proximity of the electrical connection 9 to the electromagnetic mode, present in the microdisc in operation, may introduce losses. For this reason, it is preferable for the electrically conductive material constituting the electrical connection 9 to be chosen from materials that are both electrically conductive and little (or even not) absorbent at the operating wavelength. In place of metal compounds, use may be made of ITO (mixed indium and tin oxide) for fulfilling this role, relying on FDTD (Finite Difference Time Domain) simulations.

Figure 6:
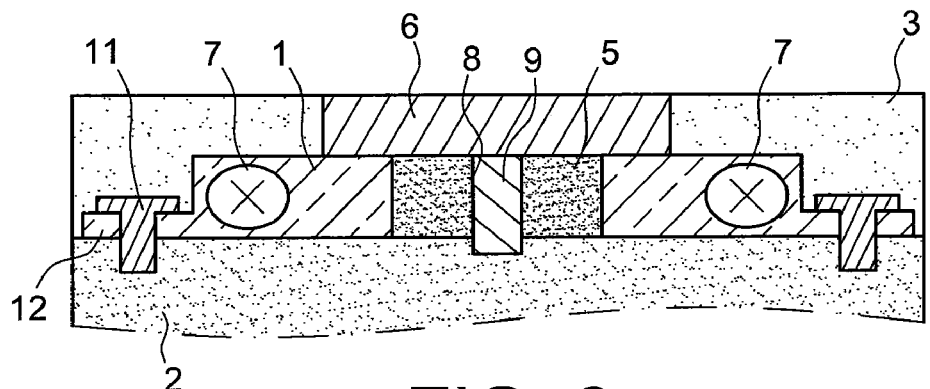
FIG. 6 is a view in transverse section of yet another microdisc on its supporting substrate at the end of production, according to the invention.

FIG. 6 is a view in transverse section of yet another microdisc on its supporting substrate at the end of production according to the invention.

In this figure, the same references as in FIG. 5 depict the same elements. The difference compared with FIG. 5 lies in the location of the lower electrical contact. It will be noted that the lower part of the microdisc has a larger diameter than the rest of the microdisc in order to form an annular part 12. The lower electrical contact 11 is located on the annular part 12. The current lines in the microdisc will therefore be parallel to the plane of the microdisc.

Figure 4:
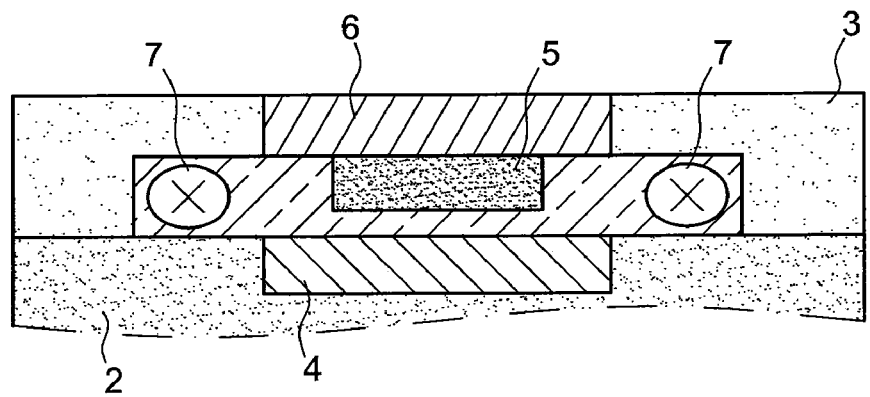
FIG. 4 is a view in transverse section of another microdisc on its supporting substrate at the end of production, according to the invention.

The lower electrical contact illustrated in FIG. 6 can also be used in the embodiment illustrated by FIG. 3 or 4.

The invention claimed is:

1. Gallery mode microdisc system for an electrically pumped optical source, the microdisc being formed on one face of a substrate and being parallel to the substrate, a part of the microdisc opposite to the lower part of the microdisc, or upper part, being provided with an electrical contact referred to as the upper contact, a central part of the microdisc, localized around a central axis of the microdisc, being electrically neutralised in order to prevent passage of an electric current through said central part, characterised in that:
   the lower part of the microdisc is provided with an electrical contact, referred to as the lower contact, in contact with the lower part to enable an electrical contact,
   the upper part of the microdisc is covered with a protective layer of electrically insulating material with an optical index lower than the optical index of the material constituting the microdisc,
   in which the central part of the electrically neutralized microdisc is an ion-implanted part implanted with $H^+$ ions.

2. Microdisc system according to claim 1, in which the substrate is a support used in microelectronics covered with a layer of electrically insulating material with a low refractive index.

3. Microdisc system according to claim 1, in which the microdisc is made from InP.

4. Microdisc system according to claim 1, in which the protective layer is made from $SiO_2$, $Si_3N_4$ or $SiO_xN_y$.

5. Electrically pumped optical source, comprising a microdisc system according to claim 1.

6. Gallery mode microdisc system for an electrically pumped optical source, the microdisc being formed on one face of a substrate and being parallel to the substrate, a part of the microdisc opposite to the lower part of the microdisc, or upper part, being provided with an electrical contact referred to as the upper contact, a central part of the microdisc, localized around a central axis of the microdisc, being electrically neutralised in order to prevent passage of an electric current through said central part, characterised in that:
   the lower part of the microdisc is provided with an electrical contact, referred to as the lower contact, in contact with the lower part to enable an electrical contact,
   the upper part of the microdisc is covered with a protective layer of electrically insulating material with an optical index lower than the optical index of the material constituting the microdisc,
   the central part of the microdisc is a core made from electrically insulating material, and
   the upper contact is electrically connected to an electrical conductor of the substrate by an electrical connection passing through the core and made from a mixed indium and tin oxide (ITO) that is a material that is little or not absorbent at the wavelength at which the microdisc system is intended to function.

7. Microdisc system according to claim 6, in which the substrate is a support used in microelectronics covered with a layer of electrically insulating material with a low refractive index.

8. Microdisc system according to claim 6, in which the microdisc is made from InP.

9. Electrically pumped optical source, comprising a microdisc system according to claim 6.

10. Gallery mode microdisc system for an electrically pumped optical source, the microdisc being formed on one face of a substrate and being parallel to the substrate, a part of the microdisc opposite to the lower part of the microdisc, or upper part, being provided with an electrical contact referred to as the upper contact, a central part of the microdisc, localized around a central axis of the microdisc, being electrically neutralised in order to prevent passage of an electric current through said central part, characterised in that:
   the upper part of the microdisc is covered with a protective layer of electrically insulating material with an optical index lower than the optical index of the material constituting the microdisc,
   the central part of the microdisc is a core made from electrically insulating material,
   the upper contact is electrically connected to an electrical conductor of the substrate by an electrical connection passing through the core, and
   the lower part of the microdisc is provided with an electrical contact, referred to as the lower contact, in contact with the lower part to enable an electrical contact, wherein the lower contact is a ring through which said electrical connection passes.

11. Microdisc system according to claim 10, in which the substrate is a support used in microelectronics covered with a layer of electrically insulating material with a low refractive index.

12. Microdisc system according to claim 10, in which the microdisc is made from InP.

13. Electrically pumped optical source, comprising a microdisc system according to claim 10.

14. Gallery mode microdisc system for an electrically pumped optical source, the microdisc being formed on one face of a substrate and being parallel to the substrate, a part of the microdisc opposite to the lower part of the microdisc, or upper part, being provided with an electrical contact referred to as the upper contact, a central part of the microdisc, localized around a central axis of the microdisc, being electrically neutralised in order to prevent passage of an electric current through said central part, characterised in that:
   the lower part of the microdisc is provided with an electrical contact, referred to as the lower contact, in contact with the lower part to enable an electrical contact,
   the upper part of the microdisc is covered with a protective layer of electrically insulating material with an optical index lower than the optical index of the material constituting the microdisc, and
   the lower part of the microdisc has a greater diameter than the rest of the microdisc in order to constitute an annular part on which the lower contact is located.

15. Microdisc system according to claim 14, in which the substrate is a support used in microelectronics covered with a layer of electrically insulating material with a low refractive index.

16. Microdisc system according to claim 14, in which the microdisc is made from InP.

17. Microdisc system according to claim 14, in which the central part of the microdisc is a core made from electrically insulating material.

18. Microdisc system according to claim 14, in which the central part of the microdisc is partially formed by a core made from electrically insulating material.

19. Microdisc system according to claim 17, in which the core is made from material with a lower optical index than that of the material constituting the microdisc.

20. Microdisc system according to claim 19, in which the core is made from $SiO_2$, $Si_3N_4$ or $SiO_xN_y$.

21. Electrically pumped optical source, comprising a microdisc system according to claim 14.

* * * * *